United States Patent
Kamikawa et al.

[11] Patent Number: 5,862,823
[45] Date of Patent: Jan. 26, 1999

[54] SUBSTRATE CLEANING METHOD AND A SUBSTRATE CLEANING APPARATUS

[75] Inventors: Yuji Kamikawa, Kumamoto-ken; Naoki Shindo, Nirasaki, both of Japan

[73] Assignee: Tokyo Electron Limited, Tokyo, Japan

[21] Appl. No.: 729,283

[22] Filed: Oct. 10, 1996

[30] Foreign Application Priority Data

Oct. 13, 1995 [JP] Japan .................................... 7-292177

[51] Int. Cl.$^6$ ...................................................... B08B 3/00
[52] U.S. Cl. .............................. 134/182; 15/77; 15/302; 134/1.3; 134/34; 134/61; 134/186; 134/902
[58] Field of Search ................... 134/182, 186, 134/902, 1.3, 34, 61; 15/302, 77

[56] References Cited

U.S. PATENT DOCUMENTS

| | | | |
|---|---|---|---|
| 4,947,784 | 8/1990 | Nishi | 414/404 |
| 5,261,431 | 11/1993 | Ueno et al. | 134/66 |
| 5,370,142 | 12/1994 | Nishi et al. | 134/61 |
| 5,503,171 | 4/1996 | Yokomizo et al. | 134/182 |

FOREIGN PATENT DOCUMENTS

| | | |
|---|---|---|
| 6-163500 | 6/1994 | Japan . |
| 6-163501 | 6/1994 | Japan . |

*Primary Examiner*—Christopher L. Chin
*Attorney, Agent, or Firm*—Oblon, Spivak, McClelland, Maier & Neustadt, P.C.

[57] ABSTRACT

The substrate cleaning method for performing cleaning processing on a plurality of substrates disposed such that front surfaces of the substrates on which a circuit pattern is to be formed extend substantially in a vertical direction. This method includes a step of picking up substrates contained in a cassette, all together, from the cassette, a step of making front surfaces of adjacent substrates face each other without bringing the front surfaces into contact with each other, while making back surfaces of adjacent substrates face each other without bringing the back surfaces into contact with each other, the front surfaces of the adjacent substrates being situated with a pitch interval $L_1$ interposed therebetween, and the pitch interval being set to be larger than a pitch interval $L_2$ interposed between the back surfaces of the adjacent substrates, a step of dipping the plurality of substrates thus disposed, all together, into a chemical solution, and a step of making the chemical solution flow between the front surfaces of adjacent substrates of the plurality of substrates, facing each other, and between the back surfaces of adjacent substrates of the plurality of substrates, facing each other.

11 Claims, 15 Drawing Sheets

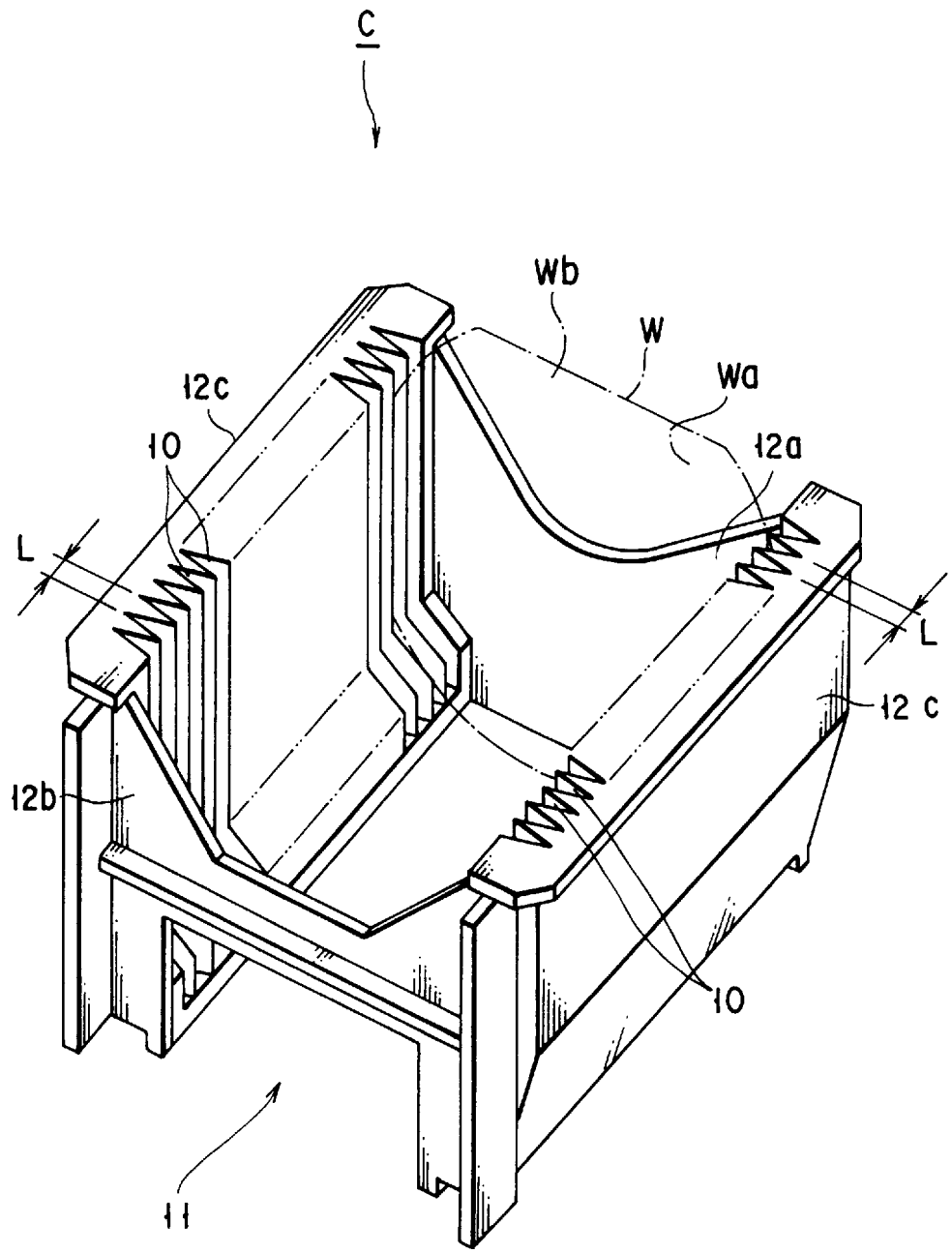
F I G. 2

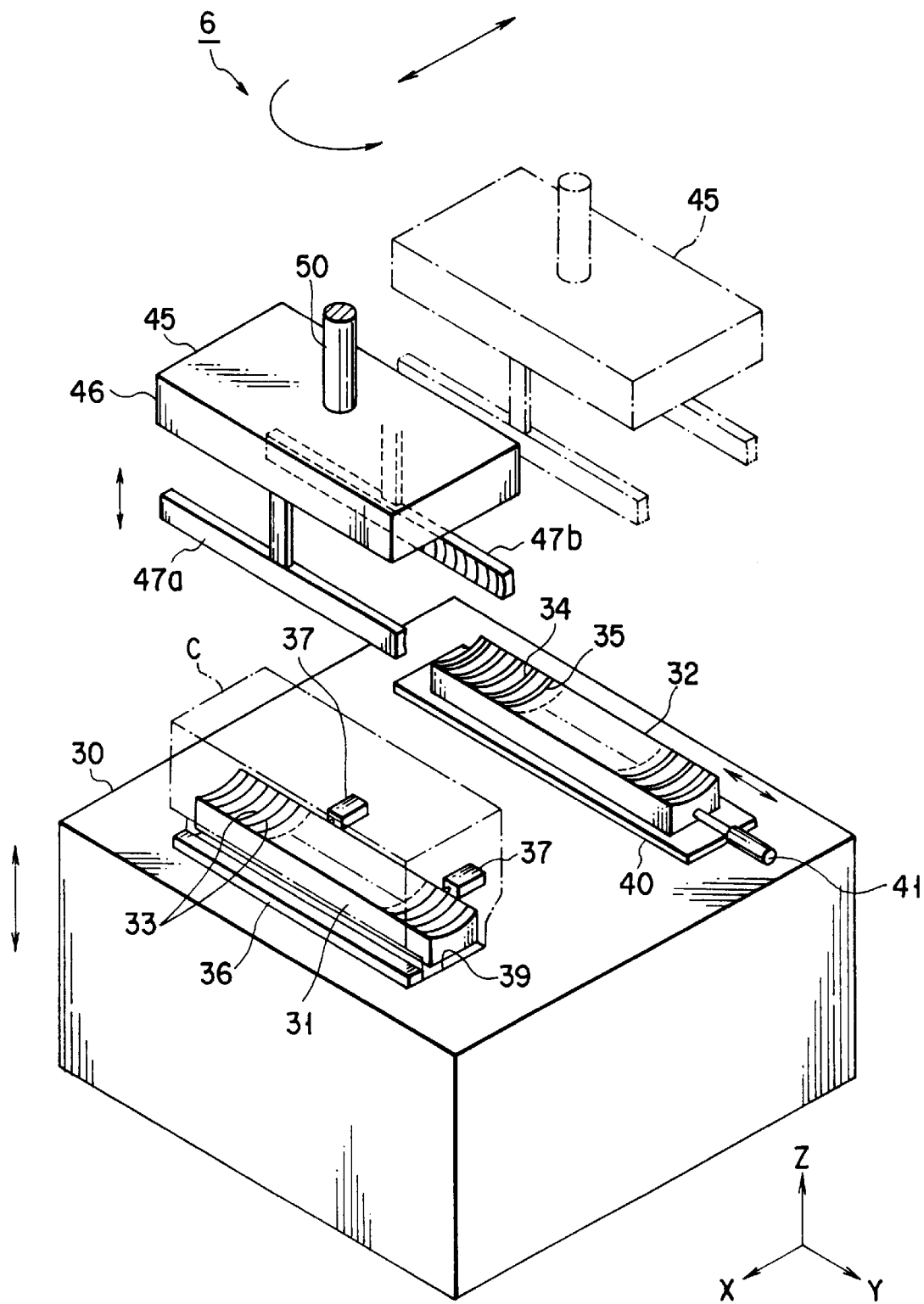
F I G. 3

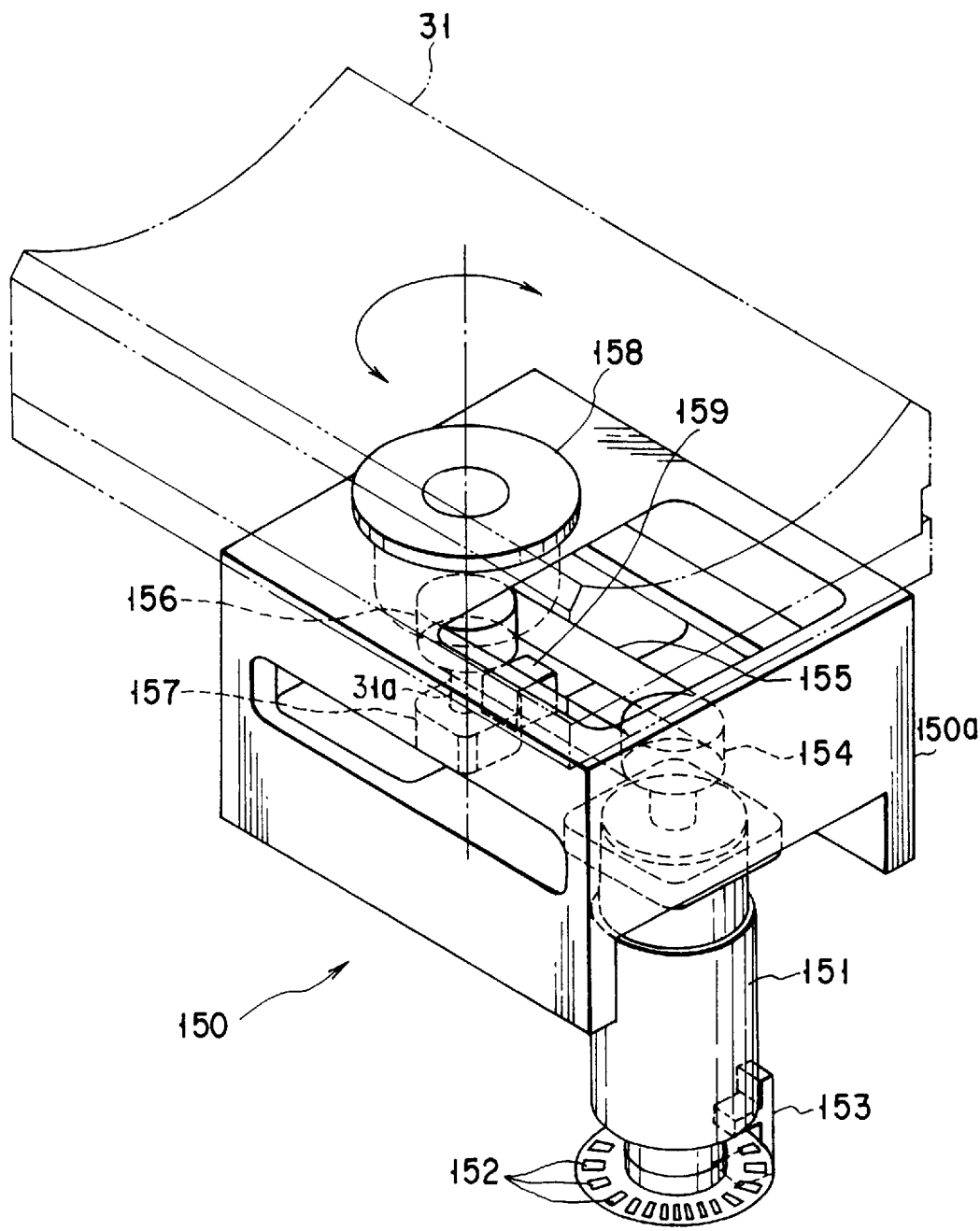
F I G. 5

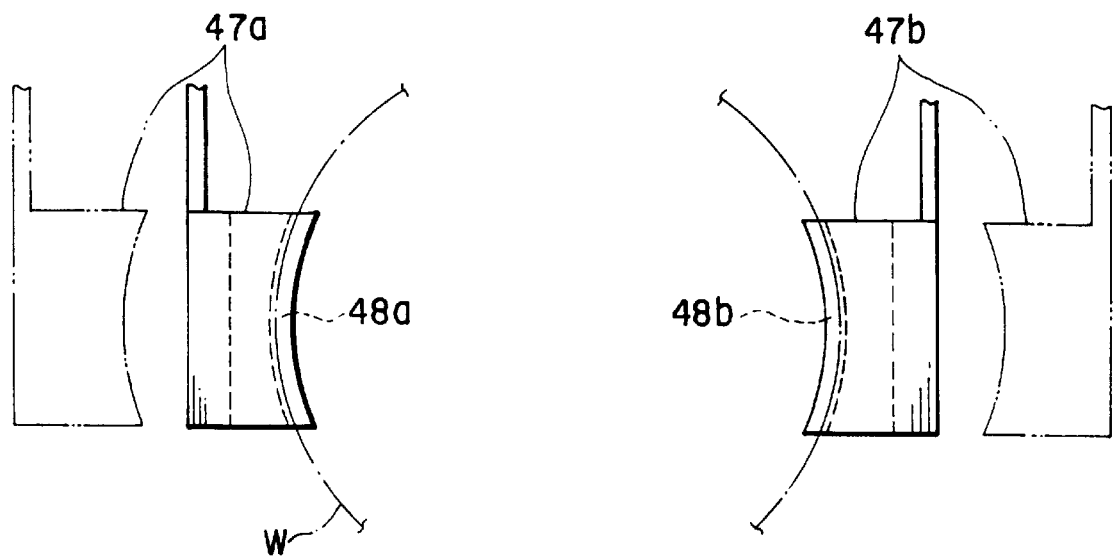
F I G. 8
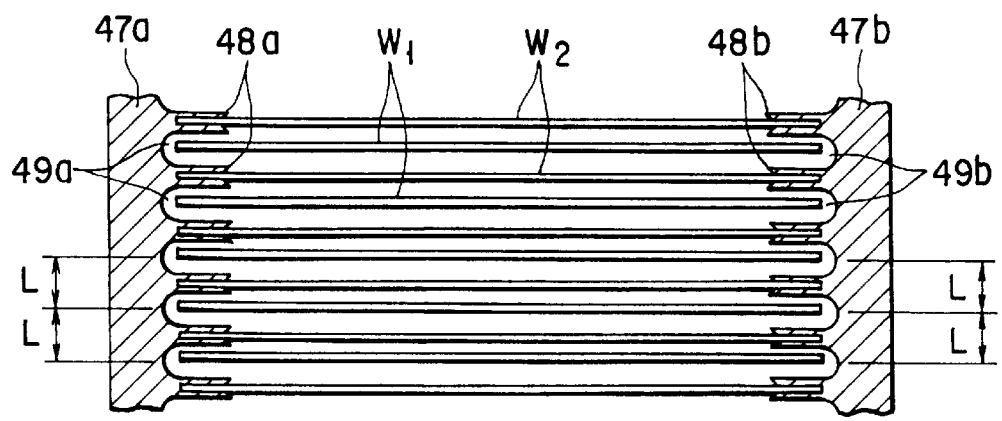
F I G. 9

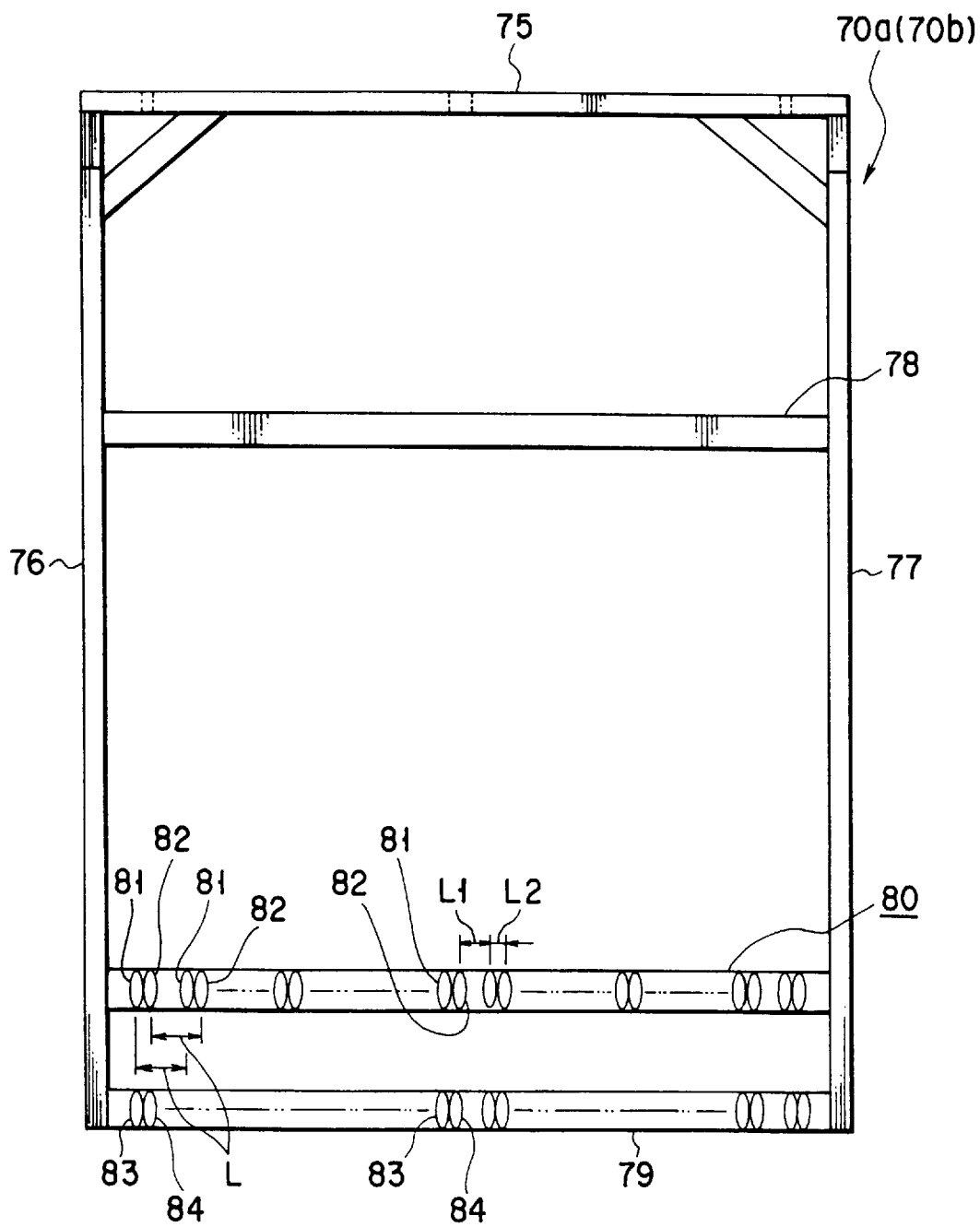
F I G. 11

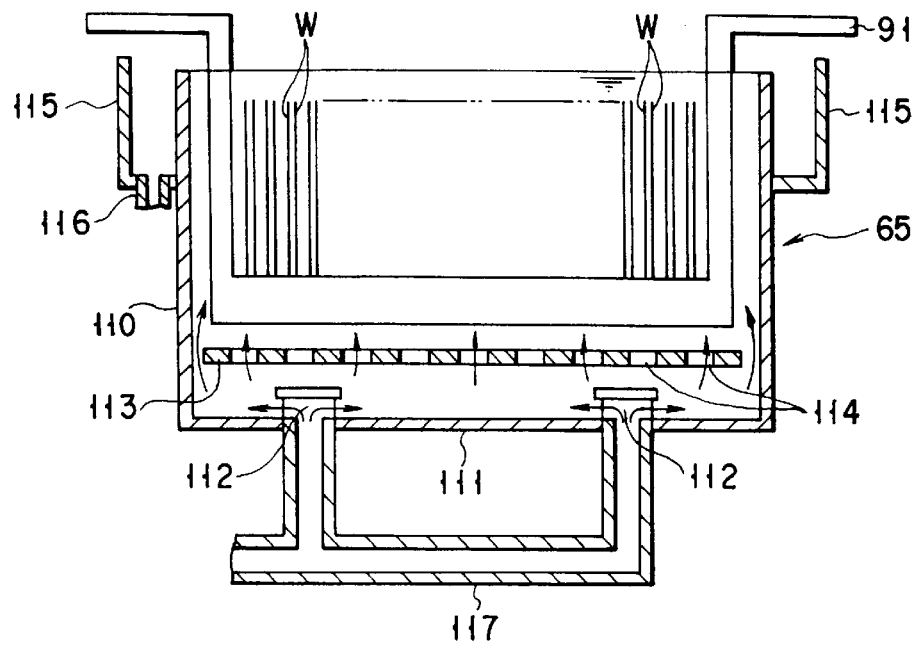
F I G. 17
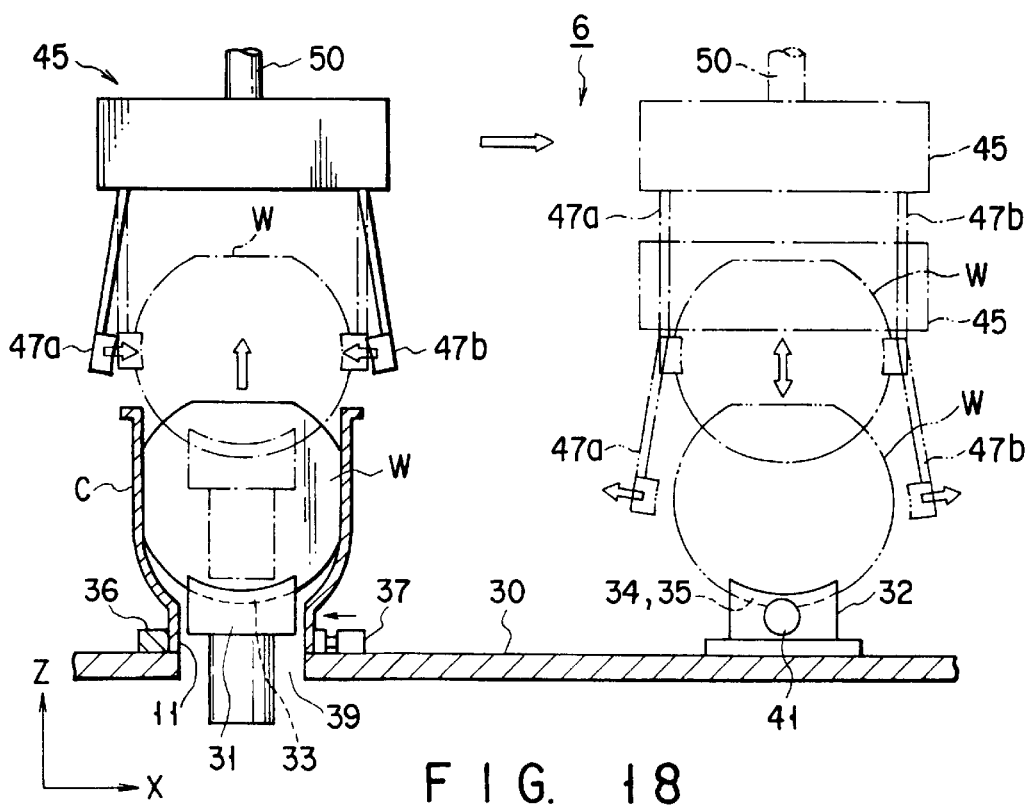
F I G. 18

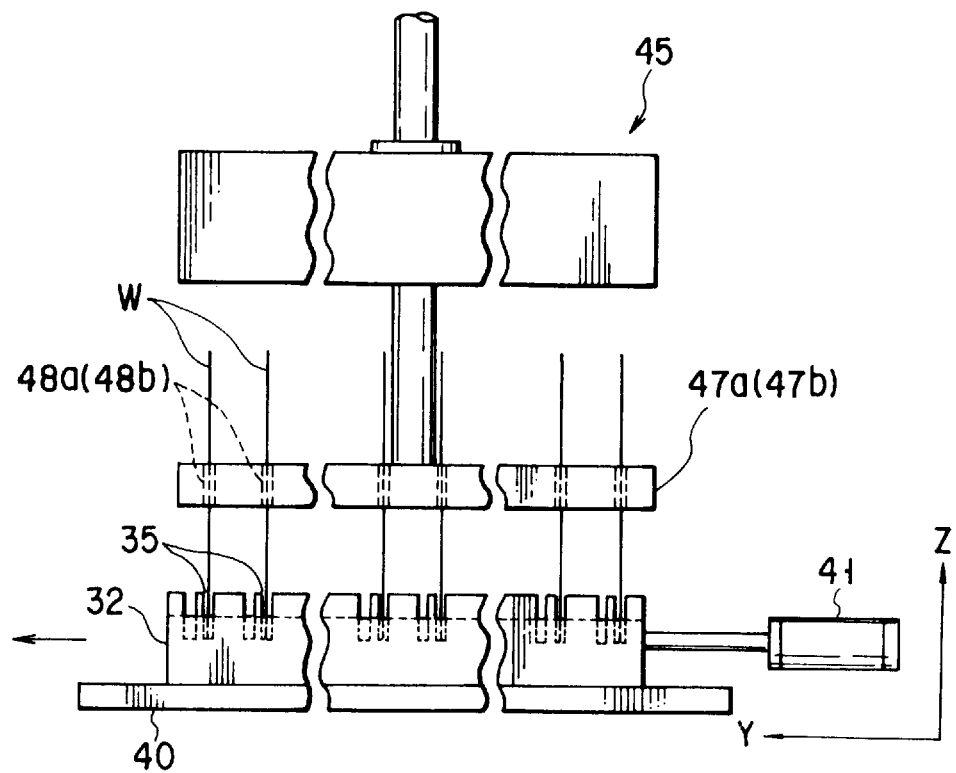
F I G. 19

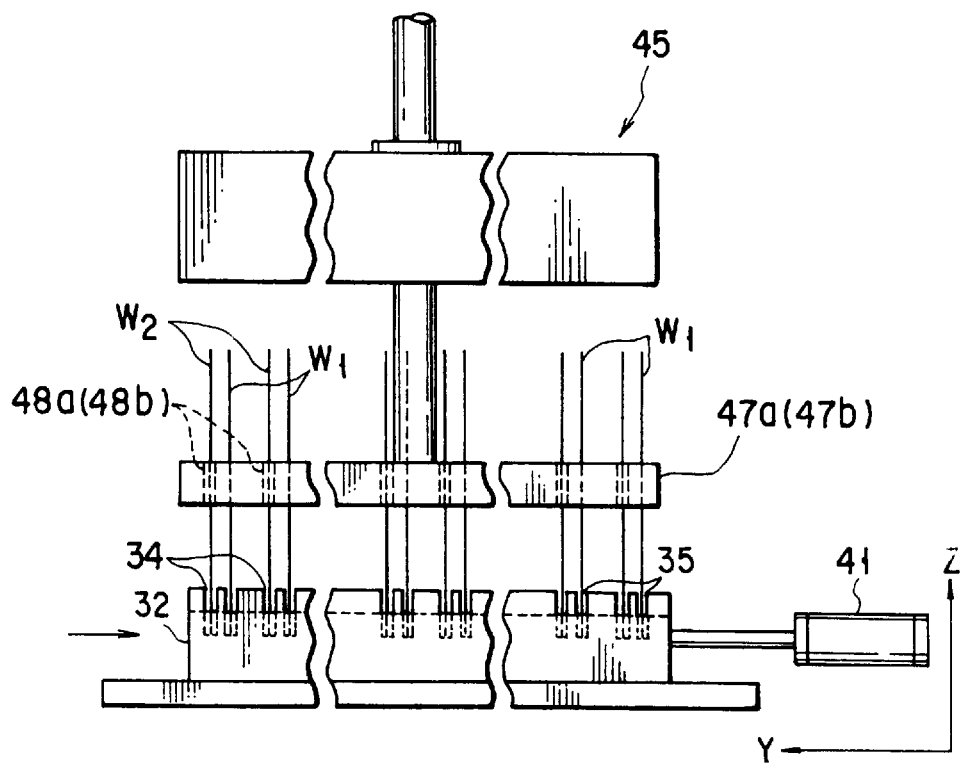
F I G. 21
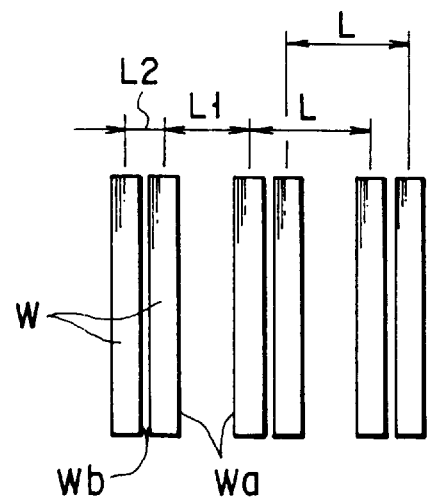
F I G. 22

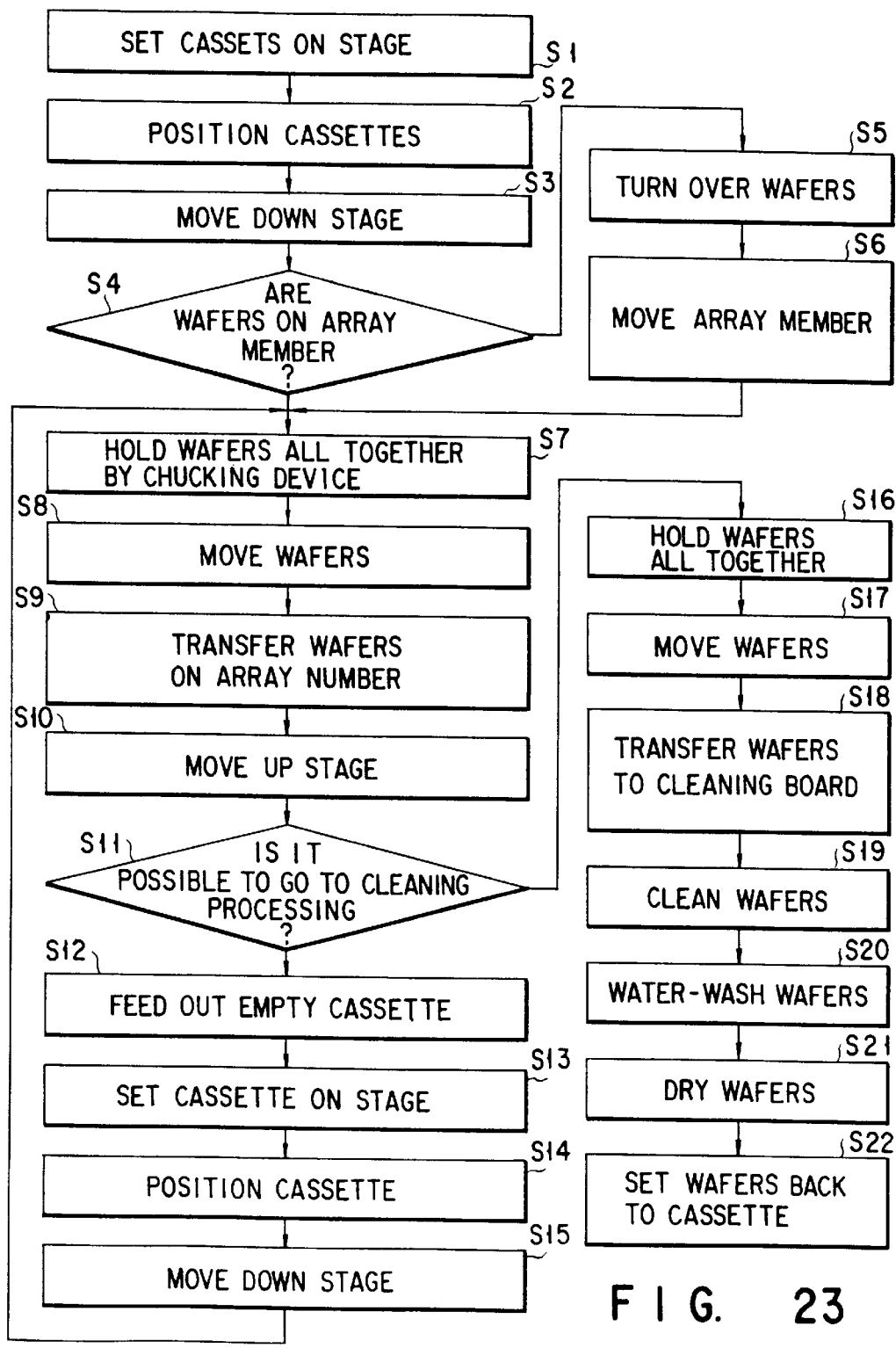
F I G. 23

SUBSTRATE CLEANING METHOD AND A SUBSTRATE CLEANING APPARATUS

BACKGROUND OF THE INVENTION

1. Field of the Invention

The present invention relates to a substrate cleaning method and a substrate cleaning apparatus in which a chemical solution is used to clean and etch a substrate such as a semiconductor wafer, an LCD glass substrate, or the like.

2. Description of the Related Art

For example, in a wafer processing step of an LSI manufacture process, a substrate cleaning apparatus of a wet type is used to remove foreign material such as particles, organic material, metal impurities, and the like. In this wet type substrate cleaning apparatus, a chemical solution such as a hydrofluoric acid solution, an ammonia hydrogen peroxide solution, such as an aqueous solution of sulfuric acid and hydrogen peroxide; an aqueous solution of hydrochloric acid and hydrogen peroxide; a phosphate solution; a solution of hydrofluoric acid and nitric acid; an aqueous solution of hydrofluoric acid and hydrogen peroxide; and a solution of hydrofluoric acid and ammonium fluoride or the like is circularly supplied to a cleaning vessel, and a number of wafers are dipped in the chemical solution.

In the wafer processing step, circuits are patterned only on the front surfaces Wa of wafers. Therefore, in general the surface Wa of each wafer is mirror-finished by a super precise polishing method, while the back surface of each wafer is finished more roughly than the front surface Wa.

As shown in FIG. 20, wafers W are contained in a cassette C at equal pitch intervals such that the front surfaces Wa of the wafers are all oriented to the same side (in the grip side of the cassette). In the cassette, the front surface Wa of the wafers respectively face the back surfaces Wb of adjacent wafers. This arrangement of wafers is common to both the cassette C and the cleaning vessel.

Back surfaces of the wafers Wb are, in many phases of the manufacturing process, in contact with supporting members, carrier members, and the likes. Therefore, foreign material such as particles tend to more easily stick to the back surfaces Wb of the wafers than to the front surfaces Wa. It is generally said that a greater amount of foreign material sticks to the back surface Wb of a wafer than to the front surface Wa thereof.

Cleaning processing of wafers is carried out in a manner in which an upward flow is generated in a cleaning vessel by supplying a chemical solution to a cleaning vessel through a bottom portion so as to overflow to an upper portion of the vessel, and a plurality of wafers are dipped in the upward flow of the chemical solution.

However, in case of a group of wafers arrayed as shown in FIG. 20, foreign material which once has left the back surfaces Wb of the wafers tends to easily stick again to the front surfaces Wa of adjacent wafers. In particular, in case of cleaning wafers having a large diameter, foreign material easily sticks again to the front surfaces Wa of the wafers so that it is difficult to increase the cleaning efficiency of the wafers.

In addition, if wafers $W_{L1}$ and $W_{L2}$ are arrayed on a board 91 at a narrow pitch interval as shown in FIG. 15, these wafers easily incline so that upper portions of adjacent wafers $W_{L1}$ and $W_{L2}$ are easily brought into contact with each other since a clearance exists between a groove 98 and the wafer $W_{L1}$ and between a groove 99 and the wafer $W_{L2}$.

In particular, when lifting up the board 91 from the cleaning vessel, a chemical solution is kept between the front surface Wa of the wafer $W_{L1}$ and the back surface Wb of the wafer $W_{L2}$, resulting in that non-uniformity in the cleaning rate appears within the surface of a wafer and that the cleaning rate varies between wafers arrayed in the same lot. However, if wafers $W_{L1}$ and $W_{L2}$ of a large diameter are arrayed at a wide pitch distance, the size of a cleaning vessel must be enlarged and a long time is required for circularly supplying a chemical solution into the cleaning vessel, so that the through-put is lowered.

Furthermore, the chemical solution is required in a large amount, increasing treatment in cleaning cost. Moreover, it takes a long time to heat the chemical solution to a predetermined temperature.

SUMMARY OF THE INVENTION

The present invention has an object of providing a substrate cleaning method in which a number of substrates can be cleaned with a high cleaning rate at a high through-put.

Another object of the present invention is to provide a compact substrate cleaning apparatus having a small size.

The substrate cleaning method according to the present invention performs cleaning processing on a plurality of substrates disposed such that front surfaces of the substrates on which a circuit pattern is to be formed extend substantially in a vertical direction, and is characterized in that:

(a) a plurality of substrates contained in a cassette are picked up entirely or partially from the cassette;

(b) front surfaces of adjacent substrates are made to face each other without bringing the front surfaces into contact with each other, and back surfaces of adjacent substrates are made to face each other without bringing the back surfaces into contact with each other, the front surfaces of the adjacent substrates being situated with a pitch interval $L_1$ interposed therebetween, and the pitch interval being set to be larger than a pitch interval $L_2$ interposed between the back surfaces of the adjacent substrates;

(c) the plurality of substrates thus disposed are dipped all together into a chemical solution; and (d) the chemical solution is made to flow between the front surfaces of adjacent substrates of the plurality of substrates, facing each other, and between the back surfaces of adjacent substrates of the plurality of substrates, facing each other.

The substrate cleaning apparatus according to the present invention performs cleaning processing on a plurality of substrates disposed such that front surfaces of the substrates on which a circuit pattern is to be formed extend substantially in a vertical direction, and the apparatus comprises:

a stage for mounting a cassette each containing a plurality of substrates substantially arranged at an equal pitch interval L;

a receive member for receiving and supporting a plurality of substrates all together from a cassette on the stage, with the pitch interval L being maintained;

elevation means for elevating up and down the receive member and the stage relative to each other, for separating a plurality of substrate all together from the cassette on the stage, and for making the receive member receive the plurality of substrates;

carrier chuck means for holding the plurality of substrates all together, from the receive member, and for carrying the plurality of substrates;

reverse means provided at at least one of the receive member and the carrier chuck means, and for reversing the plurality of substrates supported or held, all together, to reverse the orientation of the front and back surfaces of the plurality of substrates; and an array member having first and second grooves for vertically holding substrates corresponding in number to the substrates contained in the plurality of cassettes, the first grooves and second grooves being disposed alternately, and the first grooves disposed at a pitch interval greater than that at which the second grooves are disposed, and is characterized in that the substrates corresponding in number to the substrates contained in the plurality of cassettes are held by the first and second grooves in such a manner in which front surfaces of adjacent substrates face each other without bringing the front surfaces into contact with each other, while back surfaces of adjacent substrates face each other without bringing the back surfaces into contact with each other, the front surfaces of the adjacent substrates being situated with a distance $L_1$ interposed therebetween and the distance being set to be larger than a pitch interval $L_2$ interposed between the back surfaces of the adjacent substrates.

According to the present invention, the front surfaces Wa of adjacent substrates face each other. Therefore, at least foreign material which has left back surfaces of the substrates do not easily stick to the front surfaces Wa. Further, since the pitch interval $L_1$ between adjacent front surfaces Wa is larger (or wider) than the pitch interval $L_2$ between adjacent back surfaces Wb, a larger amount of processing solution flows over the front surfaces Wa than over the back surfaces Wb, so that the cleaning rate is much improved.

In other words, since the pitch interval $L_2$ between adjacent back surfaces Wb is smaller (or narrower) than the pitch interval $L_1$ between adjacent front surfaces Wa, the total length of the substrate array is shortened, so that the sizes of the processing vessel and the carrier device can be reduced in comparison with a conventional apparatus. This down-sizing of the processing vessel reduces consumption amounts of chemical solutions, pure water, IPA, and the like.

BRIEF DESCRIPTION OF THE DRAWINGS

The accompanying drawings, which are incorporated in and constitute a part of the specification, illustrate presently preferred embodiments of the invention and, together with the general description given above and the detailed description of the preferred embodiments given below, serve to explain the principles of the invention.

FIG. 2 is a perspective view schematically showing a wafer cassette;

FIG. 3 is a perspective view schematically showing a stage, a wafer mount portion, and a carrier chucking device;

FIG. 5 is an enlarged and exploded perspective view showing showing a wafer reverse mechanism;

FIG. 8 is a view showing operation of the carrier chuck device;

FIG. 9 is an array view including wafers held by the carrier chuck device and a group of wafers on the array member;

FIG. 11 is a front view showing a hold member of the wafer mount device;

FIG. 17 is a longitudinal cross-sectional view showing the inside of the cleaning processing vessel;

FIG. 18 is a front view showing a wafer mount portion viewed from the Y-axis direction, and explains operation of moving and mounting wafers from a cassette to an array portion;

FIG. 19 is a side view showing the array portion from the X-axis direction, to explain operation of moving and mounting wafers picked up from a first cassette, to the array portion;

FIG. 21 is a side view showing the array portion from the X-axis direction, to explaining operation of moving and mounting wafers picked up from a second cassette, to the array portion;

FIG. 22 is a side view showing a wafer array according to an embodiment; and

FIG. 23 is a flow-chart showing a cleaning processing method according to the embodiment of the present invention.

DETAILED DESCRIPTION OF THE PREFERRED EMBODIMENTS

In the following, a preferred embodiment of the present invention will be explained with reference to the attached drawings. In the present embodiment, a case of cleaning fifty semiconductor wafers will be explained.

Figure 1:
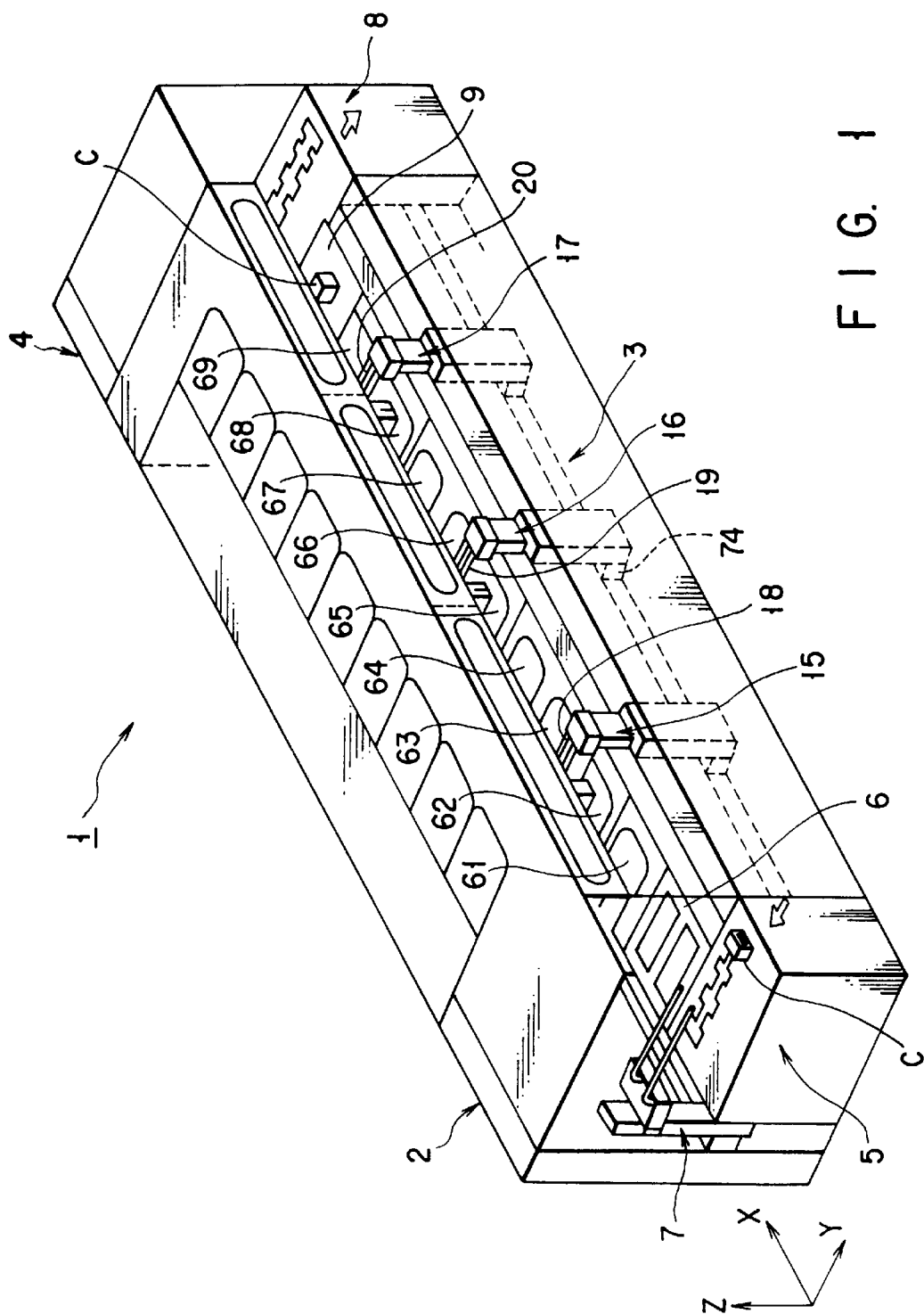
FIG. 1 is a perspective view schematically showing a cleaning apparatus.

As shown in FIG. 1, a substrate cleaning apparatus 1 comprises a loader section 2, a process section 3, and an unloader section 4. A cassette C containing wafers W which is not yet subjected to cleaning processing is carried into the loader section 2 by a carrier robot (not shown). The process section 3 comprises a wafer move base section 6, a chemical cleaning section, a water washing section, and a drying section. The wafer move base section 6 is adjacent to the loader section 2.

The loader section 2 is provided with a mount section 5 and a transfer device 7. The mount section 5 has a slider, a stopper and a cassette-turning mechanism. The cassette-turning mechanism is designed to turn a cassette by 180° on the mount section 5. The cassette C is transferred from the mount section 5 to the move base section 6, by the transfer device 7. The process section 3 is provided with three carrier devices 15, 16, and 17. These carrier devices 15, 16, and 17 can move along an X-axis trace, and respectively comprise wafer chucks 18, 19, and 20. Further, each of the carrier devices 15, 16, 17 has a Y-axis drive mechanism and a Z-axis drive mechanism and θ-drive mechanism. Note that the unloader section 4 is substantially the same component as the loader section 2, and comprises a mount section 8, a wafer move base section 9, and a transfer device (not shown).

Figure 20:
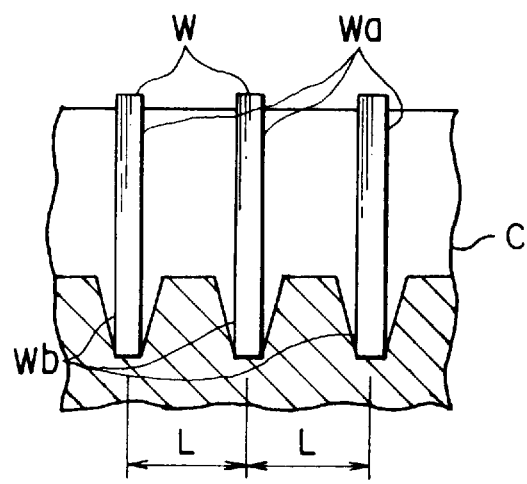
FIG. 20 is a side view showing a conventional wafer array.

As shown in FIG. 2, twenty-five grooves 10 are formed at an equal pitch interval L in the inner wall of a side portion 12c of the cassette C. Each of the grooves 10 holds one wafer W. The normal pitch interval L between the grooves 10 is set to 4.7625 mm for a 6-inch diameter wafer, 6.35 mm for a 8-inch diameter wafer, and about 9.5 to 12.5 mm for a 12-inch diameter wafer. A U-shaped notch plate 12a is provided on the front surface side of the cassette C, and a H-shaped ribbed plate 12b is provided in the rear surface side of the cassette C. An opening 11 is positioned at a lower portion of the cassette C when the contained wafers W are situated so as to extend in the horizontal direction. As shown in FIGS. 2 and 20, the front surface Wa of each wafer W faces the plate 12a of the front surface side in the cassette C, while the back surface Wb of each wafer faces the plate 12b of the rear surface side thereof.

Next, the wafer move base section 6 will be explained with reference to FIGS. 3 to 5. The wafer move base section 6 comprises an elevation stage 30, a receive member 31, an array member 32, and a carrier chuck device 45. Various mechanisms 130, 140, and 150 are provided in a casing 6a of the wafer move base 6. Operation of drive sources 131, 141, and 151 of these internal mechanisms 130, 140, and 150 is controlled by a controller (not shown).

The elevation stage 30 is elevated in the Z-axis direction by the internal mechanism 130. An opening 39 is formed in the top surface of the elevation stage 30. When the stage 30 is elevated down, the receive member 31 appears through the opening 39 without being interfered by the stage 30. As shown in FIG. 4, the internal mechanism 130 comprises a motor 131, pulleys 132 and 134, a belt 133 and a vertical screw 135. The vertical screw 135 is connected with the stage 30 by a ball nut (not shown).

The cassette C is carried to the wafer move base section 6 by the transfer device 7, and set exactly above the opening 39. A guide stopper 36 and a pusher 37 are provided on the stage 30. The guide stopper 36 is positioned in the vicinity of one side of the opening 39, and the pusher is positioned in the vicinity of the other side of the opening 39. When the cassette C is detected by a sensor 160 shown in FIG. 4, the pusher 37 presses the cassette C against the guide stopper 36, and the cassette C is positioned with respect to the array member 32. Note that a wafer counter (not shown) is provided so as to be movable along the Y-axis and so as to count the number of wafers W.

As shown in FIG. 5, the receive member 31 can be rotated by 6 turns around the Z-axis by the internal mechanism 150. The internal mechanism 150 comprises a motor 151, a rotation slit plate 152, a sensor 153, pulleys 154 and 156, a belt 155, a bearing 157, a connection member 158, and a brake 159. The bearing 157 is installed on a block 150a, rotatably supporting the vertical shaft 31a. The rotation slit plate 152 is installed on the drive shaft of the motor 151. This rotation slit plate 152 is equipped with an optical sensor 153 so that the rotation speed of the motor 151 is detected. The pulley 156, the connection member 158, and the receive member 31 are fixed on the vertical shaft 31a, and therefore, the receive member 31 is rotated together with the vertical shaft 31a around the Z-axis by θ turns. The brake 159 is used to brake the belt 155. Note that operation of the motor 151 and the brake 159 is controlled by the above-mentioned controller (not shown).

Figure 4:
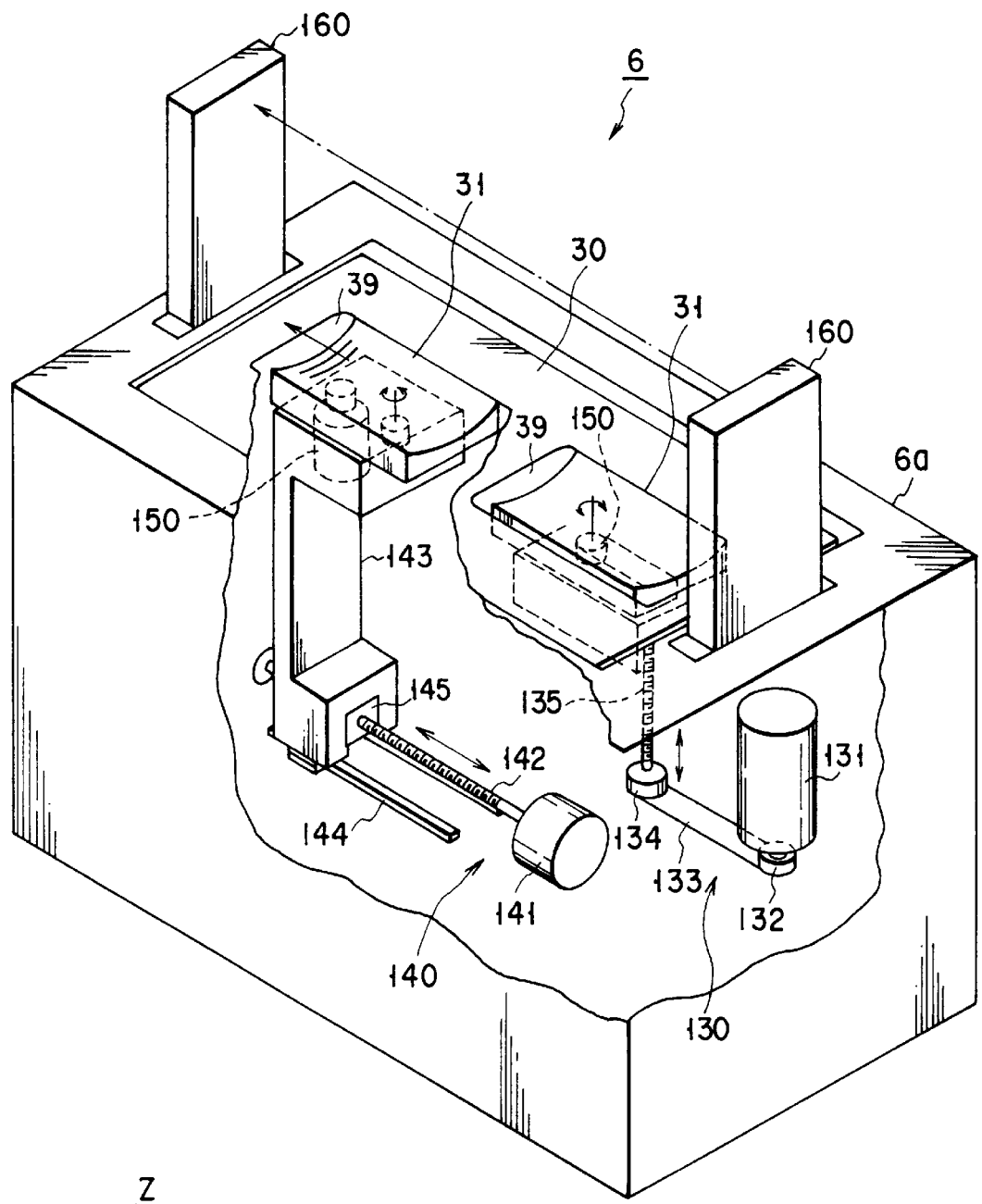
FIG. 4 is a perspective view showing the internal structure of the wafer mount portion, cutting away a part of the structure.

The receive member 31 may be arranged so as to receive fifty wafers W (equivalent to wafers of two cassettes) all together, as shown in FIG. 3, or receive members 31 may each receive separately twenty-five wafers W (equivalent to wafers of one cassette), as shown in FIG. 4. Note that one of the receive members 31 shown in FIG. 4 can be moved in the Y-axis direction by the internal mechanism 140. The internal mechanism 140 comprises a motor 141, a horizontal screw 142, a block 143, a linear guide 144, and a ball nut 145.

As shown in FIG. 3, the array member 32 is provided on the elevation stage 30 in parallel with the receive members 31. The top surface of the array member 32 is at the same level as the top surface of the receive member 31. The array member 32 can be moved in the Y-axis direction by an actuator 41.

Next, explanation will be made to the receive members 31 and the array member 32 with reference to FIGS. 6 and 7.

Figure 6:
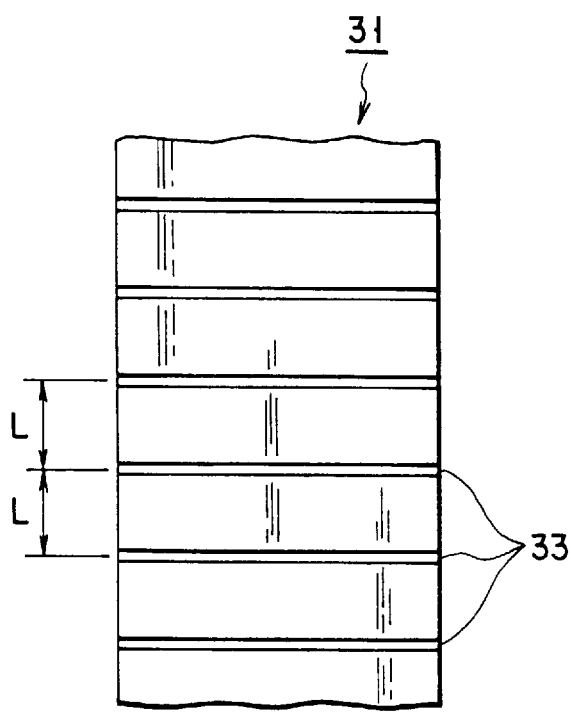
FIG. 6 is a partial enlarged view showing an upper surface of a receive member.

As shown in FIG. 6, twenty-five grooves 33 are formed in the upper surface of each receive member 31. These grooves are arranged at the same normal pitch interval L as the grooves of the cassette C.

Figure 7:
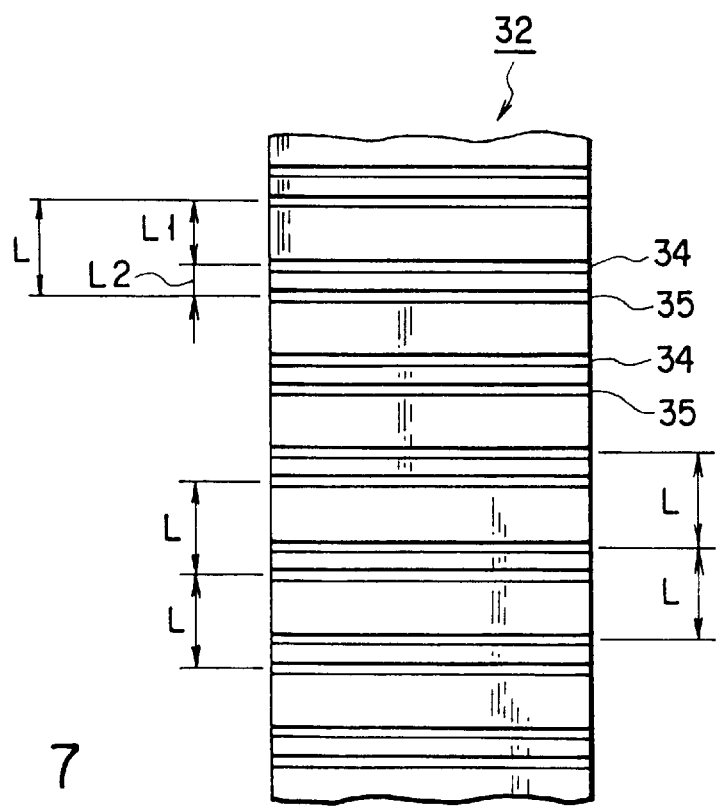
FIG. 7 is a partial enlarged view showing an array member.

Meanwhile, as shown in FIG. 7, first grooves 34 and second grooves 35 are formed alternately in parallel with each other in the upper surface of the array member 32. Twenty-five first grooves 34 are formed at the normal pitch interval L and also twenty-five grooves 35 are formed at the normal pitch interval L. The first grooves 34 and second grooves 35 are disposed such that a first interval $L_1$ and a second interval $L_2$ are alternately repeated.

The first interval $L_1$ is smaller than the normal pitch interval L and is long enough to allow a processing solution to flow between wafers when wafers W are subjected to cleaning processing. For example, the first interval $L_1$ is preferably from a half pitch (½L) to a normal pitch (L). In this embodiment, $L_1$ is set wider than $L_2$. Conversely, $L_2$ may be wider than $L_1$.

The thickness t of a wafer W is 675±20 μm in the case of a 6-inch diameter wafer, 725±20 μm in the case of an 8 inch diameter wafer, and 775±25 μm in the case of a 300 mm diameter diameter wafer.

The sum of the first interval $L_1$ and the second interval $L_2$ and the thickness of the wafer W ($L_2+L_2+t$) is equal to the normal pitch interval L.

Meanwhile, the array member is provided on the Y-axis rail 40 of the stage 30, and can be moved along the Y-axis rail 40 by an actuator 41. The movement distance of the array member is equal to the interval $L_2$. When the actuator 41 extends thereby to move the array member 32 to the rear side of the device 1, the second grooves 35 of the array member 32 are linearly aligned with the grooves 33 of the receive member 31, respectively. When the actuator 41 moves back and the array member 32 is thereby moved to the front side of the device, the first grooves 34 of the array member 32 are linearly aligned with the grooves 33 of the receive member 31, respectively.

Next, the carrier chuck device 45 will be explained with reference to FIGS. 3, 8, and 9.

The carrier chuck device 45 is provided above the stage 30 of the wafer move base section 6. The carrier chuck device 45 is connected with and supported by an elevation mechanism not shown through a pivot shaft 50. The carrier chuck device 45 comprises a pair of chucking members 47*a* and 47*b* for holding wafers W, as shown in FIG. 8. The pair of chucking members 47*a* and 47*b* are opened and closed by a mechanism (not shown) included in a main body 46. Twenty grooves 48*a* are formed in the chucking member 47*a* and twenty grooves 48*b* are formed in the chucking member 47*b*. The grooves 48*a* and 48*b* are formed at a normal pick interval L and are shaped in compliance with the outer circumferential curvature of wafers W.

As shown in FIG. 9, a space 49*a* is formed between every pair of adjacent grooves 48*a*, and a space 49*b* is formed between every pair of adjacent grooves 48*b*. These spaces 49*a* and 49*b* have a sufficient size so that wafers W do not interfere with the chucking members 47*a* and 47*b* even when the chucking members 47*a* and 47*b* are closed. By providing these spaces 49*a* and 49*b*, the wafers W on the array member 32 are prevented from colliding into the wafers W held by the chucking members 47*a* and 47*b*. Note that it is possible to make an arrangement such that the entire carrier chucking device 45 can be rotated around the pivot shaft 50 by θ turns by a θ rotation mechanism (not shown).

In the process section 3, a chuck cleaning drying processing vessel 61, a first chemical solution cleaning vessel 62, two water-wash cleaning processing vessel 63 and 64, a second chemical cleaning processing vessel 65, two water-wash cleaning processing vessels 66 and 67, a chuck cleaning drying processing vessel 68, and a drying processing vessel 69 are provided in this order from the loader section 5. In the second chemical cleaning processing vessel 65, wafers W are subjected to cleaning processing with use of a chemical solution different from the first chemical solution cleaning processing vessel 62. The water-wash cleaning processing vessels 63, 64, 66, and 67 are arranged so as to wash out a chemical solution from the wafers W with use of pure water. In the chucking cleaning drying processing vessels 61 and 68, the portion of the chemical solution sticking to the chucks 18, 19, and 20 are washed out and the wafers are dried. In the drying processing vessel 69, IPA (isopropyl alcohol) is used to dry the wafers W.

Next, the wafer carrier device will be explained. The wafer carrier devices 15, 16, and 17 substantially have an equal structure, and therefore, the carrier device 16 will be explained as an example.

Figure 10:
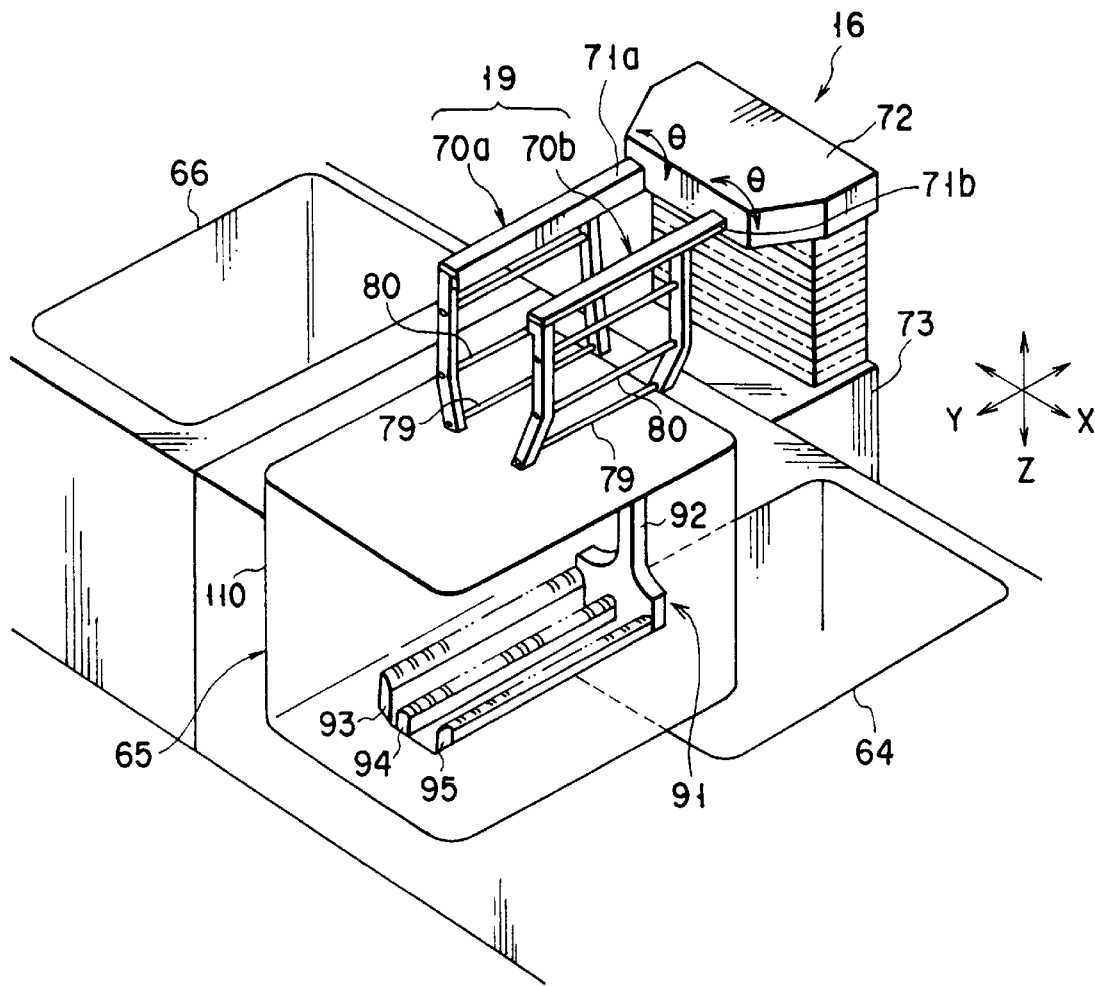
FIG. 10 is a perspective view showing a cleaning boat and a wafer mount device.

As shown in FIG. 10, the carrier device 16 comprises a wafer chuck 19 consisting of a pair of holding members 70*a* and 70*b* which are used to hold fifty wafers W all together. The holding members 70*a* and 70*b* are supported by a supporting section 72, by means of rotation shafts 71*a* and 71*b*, respectively. The supporting section 72 can be moved in the Z-axis direction by the drive mechanism 73, and the wafer chuck 19 itself can be moved in the Y-axis direction by a drive mechanism (not shown) included in the supporting section 72. Further, the drive mechanism 73 itself is provided at an upper portion of a carrier base 74 which moves along the lengthwise direction (or the X-axis direction) of the process section 3. The shafts 71*a* and 71*b* can be rotated by a motor (not shown) included in the supporting section 73.

As shown in FIG. 11, the holding member 70*a* comprises an attachment member 75 provided at an upper end of the member 70*a* and fixed on the rotation shaft 71*a* described above, stays 76 and 77 extending vertically from the front and rear end portions of the attachment member 75, a reinforcement bar 78 bridged between middle upper portions of the stays 76 and 77, a lower supporting member 79 having a rod-like shape and bridged between lower ends of the stays 76 and 77, an upper supporting member 80 having a rod-like shape and bridged in parallel above the lower supporting member.

Grooves 81 and 82 are formed in the surface of upper supporting member, and grooves 83 and 84 are formed in the surface of the lower supporting member 79. The number of each group of grooves, 81, 82, 83 and 84 is twenty-five, and therefore, fifty grooves 81 and 82 and fifty grooves 83 and 84 are formed. These grooves 81, 82, 83, and 84 are formed substantially in the same manner as the grooves 34 and 35 of the array member. Specifically, the pitch interval between any adjacent two grooves of the grooves 81 is set to the normal pitch interval L. Likewise, the pitch interval of the grooves 83, that of the grooves 82, and that of the grooves 84 are all set to the normal pitch interval L. In addition, the pitch interval between one of the grooves 81 and the next groove 82 is set to $L_1$, and the pitch interval between one of the grooves 83 and the next groove 84 is set to $L_2$. The other holding member 70*b* opposite to the holding member 70*a* has the same structure as described above.

Fifty wafers W held by the holding members 70*a* and 70*b* have front surfaces Wa facing each other, and also have back surfaces Wb facing each other. Note that the pitch interval $L_1$ between any adjacent front surfaces Wa is larger than the pitch interval $L_2$ between any adjacent back surfaces Wb. The carrier device 16 carries fifty wafers W together arrayed in the arrangement described above, between the water-wash cleaning processing vessel 64 and the chemical cleaning processing vessel 65 and the water-wash cleaning processing vessel 66.

Next, the boats of the processing vessel will be explained with reference to FIGS. 10 and 12 to 16. Note that the processing vessels 61 to 69 are substantially provided with equal boats 91, and therefore, the chemical solution cleaning processing vessel 65 will be explained as an example.

Figure 12:
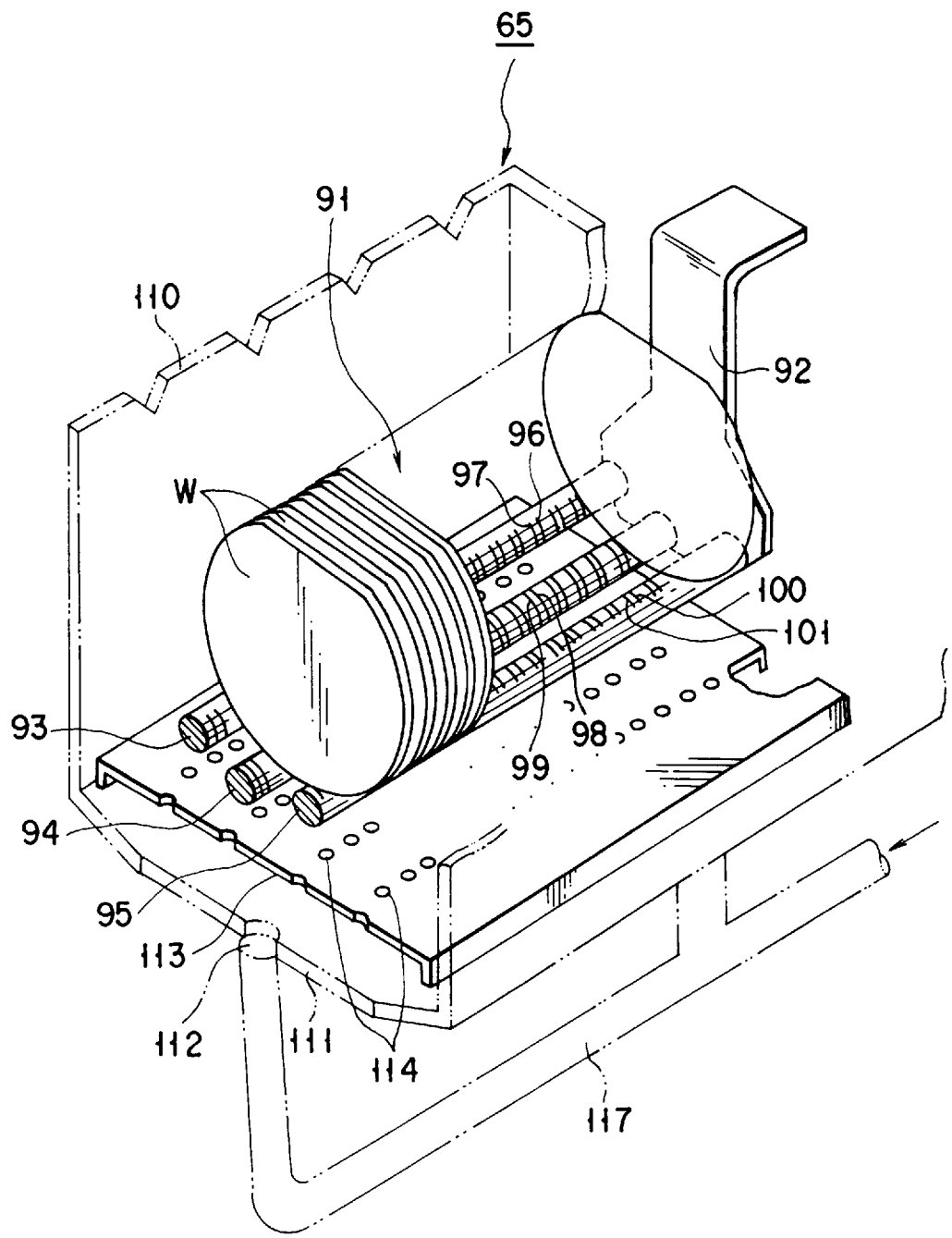
FIG. 12 is an exploded perspective view showing a cleaning processing vessel.

As shown in FIGS. 10 and 12, a boat 91 comprises a support member 92 and three holding rods 93, 94, and 95. The supporting member 92 extends from a lower portion to an upper portion in the processing vessel. Holding rods 93, 94, and 95 are horizontally cantilever-supported at a lower end of the supporting member 92. Among these rods, the center holding rod 94 is positioned lowest, both of the other side holding rods 93 and 95 are positioned slightly higher than the center holding rod 94. Twenty grooves 96 and twenty grooves 97 are formed in the upper surface of the holding rod 93. Likewise, twenty grooves 98 and twenty grooves 99 are formed in the upper surface of the holding rod 94, while twenty grooves 100 and twenty grooves 101 are formed in the upper surface of the holding rod 95.

Figure 13:
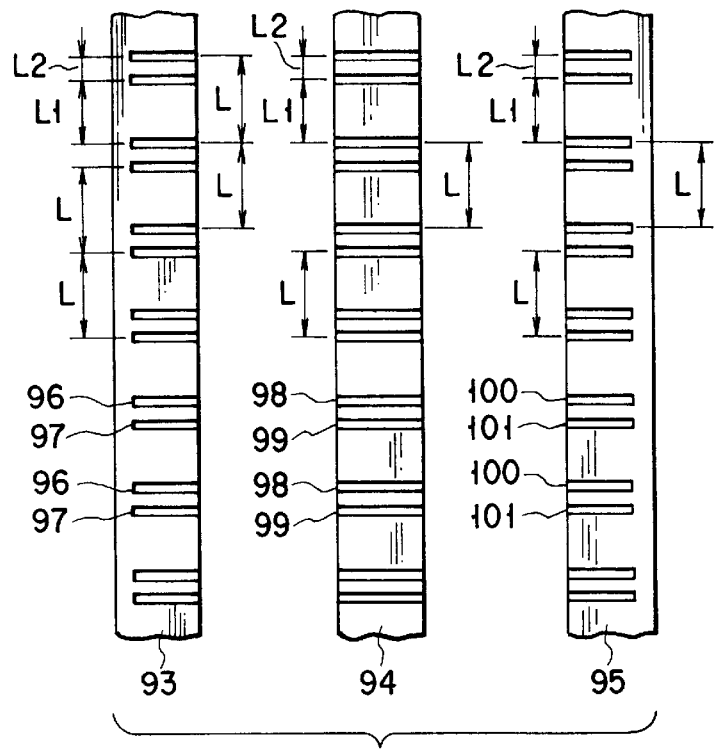
FIG. 13 is an enlarged plan view showing an top surfaces of holding rods of the cleaning boat.

As shown in FIG. 13, the arrangement of these grooves is the same as the arrangement of the grooves 34 and 35 of the array member 32. Specifically, the normal pitch interval L is commonly applied to the interval between any pair of adjacent grooves 96, that between any pair of adjacent grooves 97, that between any pair of adjacent grooves 98, that between any pair of adjacent grooves 99, that between any pair of adjacent grooves 100, and that between any pair of adjacent grooves 101. The pitch interval between a pair of a groove 96 and an adjacent groove 97, that between a groove 98 and an adjacent groove 99, as well as that between a groove 100 and an adjacent groove 101 are set to the wide pitch interval $L_1$ or the narrow pitch interval $L_2$.

Figure 14:
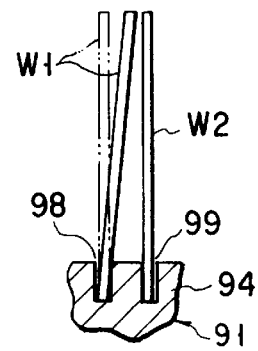
FIG. 14 is a side view showing wafers held by the cleaning boat.

Meanwhile, there is a clearance between the grooves of the rods and the wafers, and therefore, when wafers $W_1$ and $W_2$ are held by the three holding rods 93, 94, and 95, the wafers $W_1$ and $W_2$ do not stand vertically but somewhat obliquely, as shown in FIG. 14. Further, when wafers $W_{L1}$ and $W_{L2}$ having a large diameter are held by the three holding rods 93, 94, and 95, upper portions of adjacent wafers $W_{L1}$ and $W_{L2}$ are in contact with each other.

Figure 16:
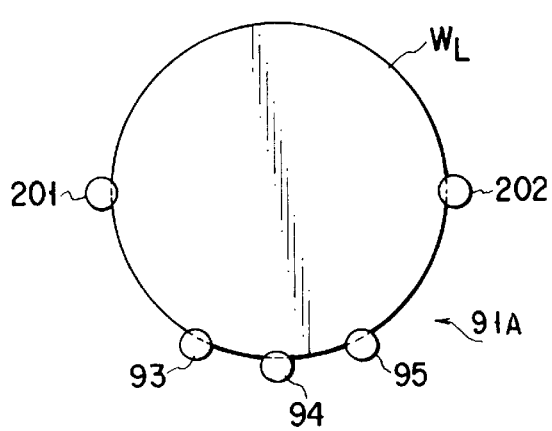
FIG. 16 is a front view schematically showing a wafer held by a cleaning boat according to an embodiment of the present invention.
Figure 15:
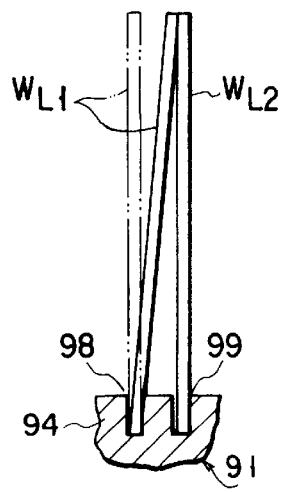
FIG. 15 is a side view showing wafers of a large diameter held by the cleaning boat.

In this respect, as shown in FIG. 16, if additional two rods 201 and 202 are provided so that wafers $W_L$ are held by total five rods 93, 94, 95, 201, and 201, adjacent wafers are not in contact with each other on the boat 91. These additional two holding rods 201 and 202 should preferably be positioned so as to correspond to the largest width portions of large diameter wafers $W_L$.

Next, explanation will be made to the chemical solution cleaning processing vessel 65 for subjecting fifty wafers W all together.

The processing vessel 65 comprises a box-like container 110 for containing a chemical solution such as an ammonium hydrogen provide solution or a hydrofluoric acid solution. The container 110 has a volume sufficient for containing fifty wafers W. A chemical solution supply port 112 is provided in the bottom portion 111 of the container 110.

As shown in FIG. 17, the chemical solution is introduced into the container 110 through the supply port 112, and flows around the wafers W, after the flow of the solution is adjusted by an adjust plate 113 in which many pores are formed. An drain port 116 is provided in the bottom portion of an outer vessel 115, and the drain port 116 is connected to the supply port 112 of the container 110 through a chemical solution circulation path 117. The chemical solution circulation path 117 is provided with a circulation pump (not shown) and a filter (not shown), so as to clean a overflowing portion of the chemical solution.

With reference to FIGS. 18, 19, and 21 to 23, explanation will now be made to a case in which fifty wafers W are subjected to processing all together in the chemical solution cleaning processing vessel 65.

At first, a cassette C is carried into the loader section 5 by a carrier robot (not shown). In the cassette C, twenty-five wafers W are contained and disposed at a normal pitch interval L. All the front surfaces Wa of contained wafers are oriented in the same direction. Two cassettes C are transferred to the wafer move base section 6, one after another, from the loader section 5.

As shown in FIG. 18, a cassette C is set on the stage 30 (in a step S1). The cassette C is pressed against the guide stopper 36, and is positioned with respect to the stage 30 (in a step S2). In this manner, the center of the lower opening 11 of the cassette C corresponds to the center of the opening 39 of the stage, thereby positioning the wafers W in the cassettes C directly above the receive member 31.

Next, the cassette C is elevated down together with the stage 30 from its home position, and all the wafers W are received by the receive member 31. The wafers W are then separated from the cassette C (in a step S3).

Laser light is irradiated from a sensor (not shown) to an area directly above the array member 32, and a light detection signal is sent to the CPU of a controller (not shown), thereby to determine whether or not wafers W exist on the array member 32 (in a step S4). If the determination result is NO, the chucking device 45 holds twenty wafers $W_1$ all together (in a step S7). These wafers $W_1$ are lifted up from the receive member 31 and are carried to the array member 32 (in a step S8). Further, as shown in FIG. 19, the chucking device 45 is elevated down, and the first group of wafers $W_1$ are transferred onto the array member 32 (in a step S9). The first group of wafers $W_1$ are respectively held by the grooves 35.

If the determination result is YES, wafers W are reversed together with the receive member 31 by a reverse mechanism 150 (in a step S5). Subsequently, twenty-five wafers $W_2$ are held all together by the chucking device 45 (in a step S7). These second group of wafers $W_2$ are lifted up from the receive member 31 and are carried to the array member 32 (in a step S8). The chucking device 45 is elevated down, and the second group of wafers $W_2$ are transferred onto the array member 32 (in a step S9). As shown in FIG. 9, since spaces 49a and 49b are provided for the chuck members 47a and 47b, the first group of wafers $W_1$ do not interfere with the chuck members 47a and 47b. The second group of wafers are respectively held by the grooves 34.

As shown in FIG. 21, the first group of wafers $W_1$ and the second group of wafers $W_2$ are alternately arranged on the array member 32. As shown in FIG. 22, the front surface Wa of a wafer $W_1$ faces the front surface Wa of a wafer $W_2$ with an interval $L_1$ interposed therebetween, and the back surface Wb of a wafer $W_1$ faces the back surface Wb of a wafer $W_2$ with an interval $L_2$ interposed therebetween.

The stage 30 is elevated up to the level of the home position (in a step S10). Whether or not fifty wafers $W_1$ and $W_2$ exist on the array member 32 is detected by a wafer counter (not shown), and the controller (not shown) determines whether or not the cleaning processing should be started, on the basis of a detection signal obtained from the wafer counter (in a step S11). If the determination result is NO, an empty cassette C on the stage 30 is carried out from the wafer move base section 6 by the transfer device 7 (in a step S12). Further, a cassette C containing wafers which are not yet subjected to processing is carried into the wafer move base section 6, and is set on the stage 30 (in a step S13). Further, the cassette C is positioned with respect to the stage 30 (in a step S14) like in the step S2. Like in the step S3, the cassette C is elevated down frown its home position together with the stage 30, and then, the wafers W are separated from the cassette C (in a step S15). Then, the same operation as performed in the steps S7 to S10 is repeated, so that wafer W are transferred on the array member 32.

If the determination result of the step S11 is YES, all the wafers $W_1$ and $W_2$ are held all together by the carrier device 16 (in a step S16), and are carried to the chemical solution cleaning processing vessel 65 (in a step S17). Then, all the wafers $W_1$ and $W_2$ are transferred onto the cleaning boat 91 (in a step S18). These wafers are subjected to cleaning processing all together (in a step S19). The supporting section 72 is elevated up thereby making the wafer chuck 19 out upwardly from the processing vessel 65, and accordingly, fifty wafers $W_1$ and $W_2$ are picked up all together from the processing vessel 65.

After cleaning processing, all the wafers $W_1$ and $W_2$ are carried to the wafer-wash processing vessel 66, and then to 67, and the wafers are subjected to water-wash processing (in a step S20). After water-wash processing, all the wafers $W_1$ and $W_2$ are carried to the drying processing section 68, and are subjected to drying processing with use of IPA vapor (in a step S21). Further, the wafers $W_1$ and $W_2$ thus processed are carried to the wafer move base section 9, and are contained into the cassette C, in units of groups of twenty-five wafers (in a step S22).

In the above embodiment, explanation has been made to a case in which the method and the apparatus according to the present invention are used to clean semiconductor wafers. However, the present invention is not limited to this case, but may be applied to a case of glass substrates for LCDs.

According to the present invention, the front surfaces Wa of adjacent substrates face each other. Therefore, at least foreign material which has left back surfaces of the substrates do not easily stick to the front surfaces Wa. Further, since the pitch interval $L_1$ between adjacent front surfaces Wa is larger than the pitch interval $L_2$ between adjacent back surfaces Wb, a larger amount of processing solution flows over the front surfaces Wa than over the back surfaces Wb, so that the cleaning rate is much improved. Therefore, the yield of cleaning processing is improved.

In addition, since the pitch interval $L_2$ between adjacent back surfaces Wb is smaller than the pitch interval $L_2$ between adjacent front surfaces Wa, the total length of the substrate array is shortened, so that the sizes of the processing vessel and the carrier device can be reduced in comparison with a conventional apparatus. This down-sizing of the processing vessel reduces consumption amounts of chemical solutions, pure water, IPA, and the like. Therefore, the cleaning processing cost is reduced.

Additional advantages and modifications will readily occur to those skilled in the art. Therefore, the invention in its broader aspects is not limited to the specific details, representative devices, and illustrated examples shown and described herein. Accordingly, various modifications may be made without departing from the spirit or scope of the general inventive concept as defined by the appended claims and their equivalents.

What is claimed is:

1. A substrate cleaning method for performing cleaning processing on a plurality of substrates disposed such that front surfaces of the substrates on which a circuit pattern is to be formed extend substantially in a vertical direction, said method comprising:

a first step of picking up a plurality of substrates contained in a cassette, entirely or partially, from the cassette;

a second step of making front surfaces of adjacent substrates face each other without bringing the front surfaces into contact with each other, while making back surfaces of adjacent substrates face each other without bringing the back surfaces into contact with each other, said front surfaces of the adjacent substrates being situated with a first pitch interval interposed therebetween, and said first pitch interval being set to be larger than a second pitch interval interposed between the back surfaces of the adjacent substrates;

a third step of dipping the plurality of substrates thus disposed, all together, into a treatment solution; and a fourth step of making the treatment solution flow between the front surfaces of adjacent substrates of the plurality of substrates, facing each other, and between the back surfaces of adjacent substrates of the plurality of substrates, facing each other.

2. A method according to claim 1, wherein a plurality of substrates are contained at an equal third pitch interval in a cassette, in the first step, and the first pitch interval of adjacent substrates facing each other is arranged to be smaller than the equal third pitch interval and larger than a half of the equal third pitch interval, in the second step.

3. A method according to claim 1, wherein a first group of substrates are disposed at a third pitch interval and oriented in the same direction as arranged in the cassette, and a second group of substrates are disposed at the third pitch interval and oriented in a direction opposite to the direction arranged in the cassette, in a manner in which the first group of substrates and the second group of substrates are disposed alternately, in the second step.

4. A method according to claim 3, wherein the second group of substrates picked up from the cassette are reversed all together, in the second step.

5. A method according to claim 1, wherein the second pitch interval between the back surfaces facing each other is larger than at least a thickness of the substrate, in the second step.

6. A substrate cleaning method for performing cleaning processing on a plurality of substrates disposed such that front surfaces of the substrates on which a circuit pattern is to be formed extend substantially in a vertical direction, said method comprising:

a first step of picking up substrates contained in a cassette from the cassette;

a second step of making front surfaces of adjacent substrates face each other without bringing the front surfaces into contact with each other, while making back surfaces of adjacent substrates face each other without bringing the back surfaces into contact with each other, said back surfaces of the adjacent substrates being situated with a first pitch interval interposed therebetween, and said fit pitch interval being set to be smaller than a second pitch interval interposed between the front surfaces of the adjacent substrates;

a third step of dipping the plurality of substrates thus disposed, all together, into a treatment solution; and a fourth step of making the treatment solution flow between the front surfaces of adjacent substrates of the plurality of substrates, facing each other, and between the back surfaces of adjacent substrates of the plurality of substrates, facing each other.

7. A substrate cleaning apparatus for performing cleaning processing on a plurality of substrates disposed such that front surfaces of the substrates on which a circuit pattern is to be formed extend substantially in a vertical direction, said apparatus comprising:

a stage for mounting single cassette or a plurality of cassettes each containing a plurality of substrates substantially arranged at an equal first pitch interval;

a receive member for receiving and supporting a plurality of substrates all together from a cassette on the stage, with the equal first pitch interval being maintained;

elevation means for elevating up and down the receive member and the stage relative to each other, for separating a plurality of substrate all together from the cassette on the stage, and for making the receive member receive the plurality of substrates;

carrier chuck means for holding the plurality of substrates all together, from the receive member, and for carrying the plurality of substrates;

turn over means provided at least one of the receive member and the carrier chuck means, and for turning over the plurality of substrates supported or held, all together, to reverse the orientation of the front surfaces and back surfaces of the plurality of substrates; and an array member having first grooves and second grooves for vertically holding substrates corresponding in number to the substrates contained in the plurality of cassettes, said first grooves and second grooves being disposed alternately, wherein the substrates corresponding in number to the substrates contained in the plurality of cassettes are held by the first grooves and second grooves in such a manner in which front surfaces of adjacent substrates face each other without bringing the front surfaces into contact with each other, while back surfaces of adjacent substrates face each other without bringing the back surfaces into contact with each other, said front surfaces of the adjacent substrates being situated with a first distance interposed therebetween and said first distance being set to be larger than a second pitch interval interposed between the back surfaces of the adjacent substrates.

8. An apparatus according to claim 7, wherein the first grooves and second grooves are formed in the array member such that the first distance of adjacent substrates facing each other is smaller than the equal first pitch interval at which the plurality of substrates are disposed in the cassettes and larger than a half of the equal first pitch interval.

9. An apparatus according to claim 7, wherein the first grooves and second grooves are formed in the array member in such a manner in which the second pitch interval between the back surfaces of adjacent substrates facing each other is larger than at least a thickness of the substrate.

10. An apparatus according to claim 7, further comprising a container supplied with a treatment solution, a boat for dipping the substrates corresponding in number to the plurality of substrates contained in the plurality of cassettes, into the treatment solution in the container, said boat has three holding rods in each of which grooves are formed substantially in the same arrangement as the first grooves and second grooves are formed in the array member, second carrier chuck means for transferring the substrates onto the boat, and a holding member provided in the vessel, for preventing the substrate from falling down above the three holding rods.

11. An apparatus according to claim 10, wherein said holding member consists of two holding rods having grooves substantially in the same arrangement as the first grooves and the second grooves in the array member and hold the substrates in the vicinity of a center of each of the substrates.

* * * * *